US012638781B2

(12) United States Patent
Xu et al.

(10) Patent No.: US 12,638,781 B2
(45) Date of Patent: May 26, 2026

(54) METHOD AND SYSTEM FOR CREATING A STICHED DESIGN FILE

(71) Applicant: Applied Materials, Inc., Santa Clara, CA (US)

(72) Inventors: Yongan Xu, Santa Clara, CA (US); Jin Xu, Sunnyvale, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 269 days.

(21) Appl. No.: 18/332,027

(22) Filed: Jun. 9, 2023

(65) Prior Publication Data

US 2023/0408928 A1     Dec. 21, 2023

Related U.S. Application Data

(60) Provisional application No. 63/366,110, filed on Jun. 9, 2022.

(51) Int. Cl.
*G03F 7/00*        (2006.01)
*G03F 9/00*        (2006.01)

(52) U.S. Cl.
CPC ...... *G03F 7/70475* (2013.01); *G03F 7/70633* (2013.01); *G03F 7/70683* (2013.01); *G03F 9/7046* (2013.01); *G03F 9/7088* (2013.01)

(58) Field of Classification Search
CPC ............ G03F 7/70475; G03F 7/70633; G03F 7/70683; G03F 9/7046; G03F 9/7088; G03F 7/70625; G03F 7/706833
See application file for complete search history.

(56) References Cited

U.S. PATENT DOCUMENTS

| | | | |
|---|---|---|---|
| 5,298,761 | A | 3/1994 | Aoki et al. |
| 7,631,286 | B2 | 12/2009 | Piper et al. |
| 8,359,556 | B1 | 1/2013 | Abou Ghaida et al. |
| 8,429,570 | B2 | 4/2013 | Bailey et al. |
| 8,434,033 | B2 | 4/2013 | Abou Ghaida et al. |

(Continued)

FOREIGN PATENT DOCUMENTS

| | | | | |
|---|---|---|---|---|
| JP | 2011135022 A | * | 7/2011 | ............ G01B 15/00 |
| KR | 10-2004-0104960 A | | 12/2004 | |

OTHER PUBLICATIONS

PCT Notification of Transmittal of the International Search Report and the Written Opinion of the International Searching Authority for International Application No. PCT/US2023/024904; dated Oct. 4, 2023.

*Primary Examiner* — Michael P LaPage
(74) *Attorney, Agent, or Firm* — Patterson + Sheridan, LLP

(57) ABSTRACT

A system, software application, and method for optical device metrology of optical device patterns formed from lithography stitching are provided. In one example, the method includes creating a stitched design file comprising images of a plurality of masks; defining target coordinates for each of the plurality of masks in the stitched design file; defining an alignment mark for the stitched design file; capturing images of an optical device pattern at each of the target coordinates; comparing the captured images of the optical device pattern at each of the target coordinates to virtual images of the stitched design file at each of the target coordinates; and determining whether the optical device pattern at each of the target coordinates meets a threshold value.

20 Claims, 7 Drawing Sheets

(56) References Cited

U.S. PATENT DOCUMENTS

| | | | |
|---|---|---|---|
| 8,715,909 B2 * | 5/2014 | Gutmann | G03F 7/70283 |
| | | | 430/311 |
| 9,384,307 B2 | 7/2016 | Hsu et al. | |
| 10,685,158 B2 | 6/2020 | Liu | |
| 12,292,692 B2 * | 5/2025 | Zhu | G03F 7/70475 |
| 2003/0093251 A1 * | 5/2003 | Chang | G03F 1/84 |
| | | | 430/5 |
| 2008/0250380 A1 * | 10/2008 | Kijima | G03F 7/70625 |
| | | | 716/104 |
| 2009/0298205 A1 * | 12/2009 | Nagahara | G03F 1/70 |
| | | | 257/E21.53 |
| 2013/0253681 A1 * | 9/2013 | Hsieh | G05B 19/02 |
| | | | 700/97 |
| 2014/0019927 A1 | 1/2014 | Yudhistira et al. | |
| 2015/0067628 A1 * | 3/2015 | Torres Robles | G03F 1/38 |
| | | | 716/112 |
| 2019/0033706 A1 * | 1/2019 | Yu | G03F 1/70 |
| 2019/0146358 A1 | 5/2019 | Jochemsen et al. | |
| 2020/0273899 A1 * | 8/2020 | Ogura | H10F 39/024 |
| 2021/0223704 A1 * | 7/2021 | Xu | G03F 7/70475 |
| 2023/0288796 A1 * | 9/2023 | Fujimura | H01J 37/3174 |
| 2023/0367229 A1 * | 11/2023 | Yu | G03F 1/70 |
| 2024/0012978 A1 * | 1/2024 | Inumpudi | G03F 7/70291 |
| 2024/0289532 A1 * | 8/2024 | Fujimura | G06F 30/398 |

* cited by examiner

METHOD AND SYSTEM FOR CREATING A STICHED DESIGN FILE

RELATED APPLICATIONS

This application claims benefit of and priority to U.S. Application No. 63/366,110, filed Jun. 9, 2022, the entire contents of which are incorporated herein by reference.

BACKGROUND

Embodiments of the present disclosure generally relate to optical devices and a method of optical device metrology. More specifically, embodiments described herein relate to a system, a software application, and a method for optical device metrology of optical device patterns formed from lithography stitching.

DESCRIPTION OF THE RELATED ART

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as optical devices to display a virtual reality environment that replaces an actual environment.

Augmented reality, however, enables an experience in which a user can still see through the optical devices of the glasses or other HMD device to view the surrounding environment, yet also see images of virtual objects that are generated for display and appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

Specifically, maintaining color uniformity and a high coupling efficiency of optical devices can be challenging. Color uniformity and coupling efficiency are related to the optical interference between different light paths within the optical device. Accordingly, what is needed in the art are improved methods of modulating the optical interference to enhance the light coupling efficiency to the outcoupler and optimizing the efficiency across the field of view is desired.

Photolithography is widely used in the manufacturing of semiconductor devices and display devices, such as optical devices. In certain embodiments, these optical devices, may be fabricated from a substrate having a diameter of 200 mm or greater, such as a 200 mm or 300 mm substrate, i.e., a large-scale substrate. The large-scale substrate may then be processed to form multiple optical devices.

Conventionally, lithography techniques on a large-scale substrate to form an optical device pattern for each of the multiple optical devices requires multiple masks to be stitched together in order to accommodate the large substrate size. A large-scale substrate-sized mask may in turn result in reduced resolution. Stitching of multiple masks is required as the size of the optical device pattern for each optical device is larger than the size of a conventional mask. However, when multiple masks are stitched together, the location at the mask doesn't align with the location on a pattern because the patterns generally comprise single masks. Additionally, when multiple masks are used for lithography via stitching, conventional data based metrology (DBM) may not be obtainable. Further, when there are multiple masks, no automated critical dimension (CD)-SEM recipe is available.

Accordingly, what is needed in the art is a system, a software application, and a method for optical device metrology of optical device patterns formed from lithography stitching.

SUMMARY

Embodiments described herein generally relate to a system of optical device metrology. More particularly, the present disclosure described herein provides an optical device metrology system having a stage; a camera; a mask; and a controller. The system further includes the controller being configured to create a stitched design file comprising images of a plurality of masks; define target coordinates for each of the plurality of masks in the stitched design file; define an alignment mark for the stitched design file; capture images of an optical device pattern at each of the target coordinates with the camera, the optical device pattern corresponding to a substrate disposed on the stage and patterned using the mask; compare the captured images of the optical device pattern at each of the target coordinates to virtual images of the stitched design file at each of the target coordinates; and determine whether the optical device pattern at each of the target coordinates meets a threshold value.

In another embodiment, a method for optical device metrology of optical device patterns is provided. The method includes creating a stitched design file comprising images of a plurality of masks; defining target coordinates for each of the plurality of masks in the stitched design file; defining an alignment mark for the stitched design file; capturing images of an optical device pattern at each of the target coordinates; comparing the captured images of the optical device pattern at each of the target coordinates to virtual images of the stitched design file at each of the target coordinates; and determining whether the optical device pattern at each of the target coordinates meets a threshold value.

In yet another embodiment, a non-transitory computer readable medium has instructions stored thereon, which, when executed by a processor, causes a computer system to perform operations of the above method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present subject matter generally relate to optical device fabrication. In particular, embodiments described herein relate to methods for optical device metrology of optical device patterns formed from lithography stitching.

As used herein "large optical device" relates to any optical device which is larger in size in at least one dimension than a photomask used to pattern the optical device in a lithography process. Additionally, in the aspects described below alignment mark shapes and polygons are representative to give an example. The shape of an alignment mark is not limited by the cross shape. The alignment mark may be any shape. Similarly, the shape of the polygons for the design files are not limited by the circle, triangle, and rectangles shown. The polygons may be any shape. The illustrated embodiments, therefore, are merely descriptive in nature and should not be considered limiting.

Figure 1:
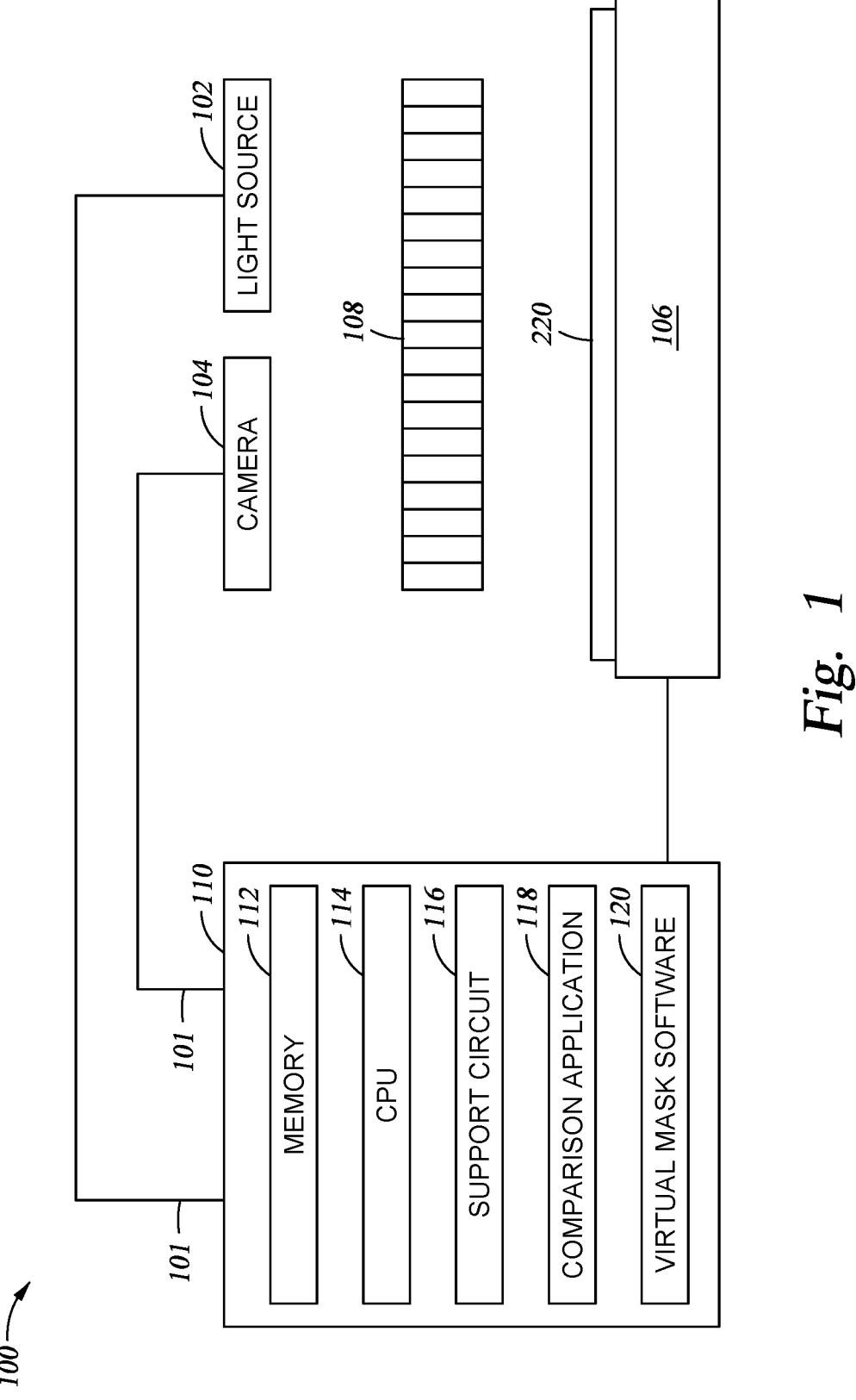
FIG. 1 is a schematic diagram of a lithography environment according to embodiments described herein.

FIG. 1 is a schematic diagram of an exemplary lithography environment 100, according to certain embodiments. As shown, the lithography environment 100 includes, but is not limited to, lithography environment devices including a light source 102, a camera 104, a stage 106, a mask 108, a controller 110, and communication links 101. The controller 110 is operable to facilitate the transfer of a digital pattern file (e.g., data) to the controller 110. Each of the lithography environment devices is operable to be connected to each other via the communication links 101. Each of the lithography environment devices is operable to be connected to the controller 110 by the communication links 101. The lithography environment 100 can be located in the same area or production facility, or the each of the lithography environment devices can be located in different areas.

Each of the plurality of lithography environment devices are additionally indexed with method 300 operations described herein. In one embodiment, which can be combined with other embodiments described herein, the controller 110 includes a memory 112, a central processing unit (CPU) 114, a support circuit 116, a comparison application 118, and a virtual mask software 120. The controller 110 is operable to execute the comparison application 118 and the virtual mask software application 120. The memory 112 is configured to store instructions corresponding to any portion of the method 300 described below. The communication links 101 may include at least one of wired connections, wireless connections, satellite connections, and the like. The communications links 101 facilitate sending and receiving files to store data, according to embodiments further described herein. Transfer of data along communications links 101 can include temporarily or permanently storing files or data in the cloud, before transferring or copying the files or data.

As noted above, the controller 110 includes central processing unit (CPU) 114, support circuits 116 and memory 112. The CPU 114 can be one of any form of computer processor that can be used in an industrial setting for controlling the lithography environment devices. The memory 112 is coupled to the CPU 114. The memory 112 can be one or more of readily available memory, such as random access memory (RAM), read only memory (ROM), floppy disk, hard disk, or any other form of digital storage, local or remote. The support circuits 116 are coupled to the CPU 114 for supporting the processor. These circuits include cache, power supplies, clock circuits, input/output circuitry, subsystems, and the like. The controller 110 can include the CPU 114 that is coupled to input/output (I/O) devices found in the support circuits 116 and the memory 112.

The controller 110 can include one or more software applications, such as the comparison application 118 and the virtual mask software 120. The controller 110 can also include media data stored by the memory 112 that is used by the CPU 114 to perform the method 300 described herein. The CPU 114 can be a hardware unit or combination of hardware units capable of executing software applications and processing data. In some configurations, the CPU 114 includes a digital signal processor (DSP), an application-specific integrated circuit (ASIC), and/or a combination of such units. The CPU 114 is configured to execute the one or more software applications, such as the comparison application 118 and the virtual mask software 120, and process the stored media data, which can be each included within the memory 112. The controller 110 controls the transfer of data and files to and from the various lithography environment devices. The memory 112 is also configured to store instructions corresponding to any operation of the method 300 according to embodiments described herein.

The controller 110 may facilitate the control and automation of a digital lithography process based on the digital pattern file provided. The digital pattern file (or computer instructions), which may be referred to as an imaging design file, readable by the controller 110, determines which tasks are performable on a substrate. The digital pattern file corresponds to an optical device pattern to be written into the photoresist using electromagnetic radiation output.

The digital pattern file may be provided in different formats. For example, the format of the digital pattern file may be one of a GDS format or an OASIS format, among others. The digital pattern file includes information corresponding to features of exposure patterns to be generated on a substrate. The digital pattern file may include areas of interest which correspond to one or more structural elements. The structural elements may be constructed as geometrical shapes (e.g., polygons).

A stage 106 is provided to support a substrate. In some embodiments, the stage is operable to move in the X and Y directions for processing. The processing position may be located beneath the light source 102 and/or the camera 104, for example. A metrology system measures the X and Y lateral position coordinates of the stage 106 in real-time so that the location of the patterns can be accurately measured.

The light source 102 is configured to produce a light beam having a predetermined wavelength. In one example a wavelength in the blue range, less than about 450 nm, is produced by the light source 102. The light source 102 is any suitable light source, such as a light emitting diode (LED) or a laser, capable of producing a light having predetermined wavelength. In some embodiments, the light source 102 may include microLEDs, digital micromirror devices (DMDs) and liquid crystal displays (LCDs). In operation, the light source 102 is used to project the light through the mask 108 to the substrate.

The camera 104 is configured to capture an image of the substrate once the light source 102 projects light through the mask 108 onto the substrate. The captured image is stored in memory 112 for use by the comparison application 118. The comparison application 118 is executable to compare a captured image of the substrate to the digital pattern file. The CPU 114 is configured to execute the comparison application 118 software program. In another embodiment, which can be combined with other embodiments described herein, the comparison application 118 may be a remote computer server which includes a controller and a memory (e.g., data store).

In some embodiments, the camera 104 is fixed over the stage 106 containing the substrate. In other embodiments, the camera 104 may be movable over the surface of the substrate to allow for scanning of the surface. In other embodiments, more than one camera 104 may be used such that the entire field of view of all the cameras may view the entire substrate.

The digital pattern file is provided to the controller 110. As will be discussed in more detail below, the digital pattern file comprises a stitched digital pattern file. The controller 110 applies the virtual mask software application 120 to the digital pattern file. The virtual mask software application 120 can be a vMASC software. In one embodiment, which can be combined with other embodiments described herein, the virtual mask software application 120 is a software program stored in the memory 112 of the controller 110. The CPU 114 is configured to execute the software program. In another embodiment, which can be combined with other embodiments described herein, the virtual mask software application 120 may be a remote computer server which includes a controller and a memory (e.g., data store).

The digital pattern file is converted into a virtual mask file by the virtual mask software application 120. The virtual mask file is a digital representation of the design to be printed by the lithography environment device. The virtual mask file is provided to the lithography environment device via the communication links 101.

While FIG. 1 depicts an exemplary embodiment of a photolithography system, other systems, environments, and configurations are also contemplated herein. For example, photolithography systems including any suitable number of stages are also contemplated.

Figure 2A:
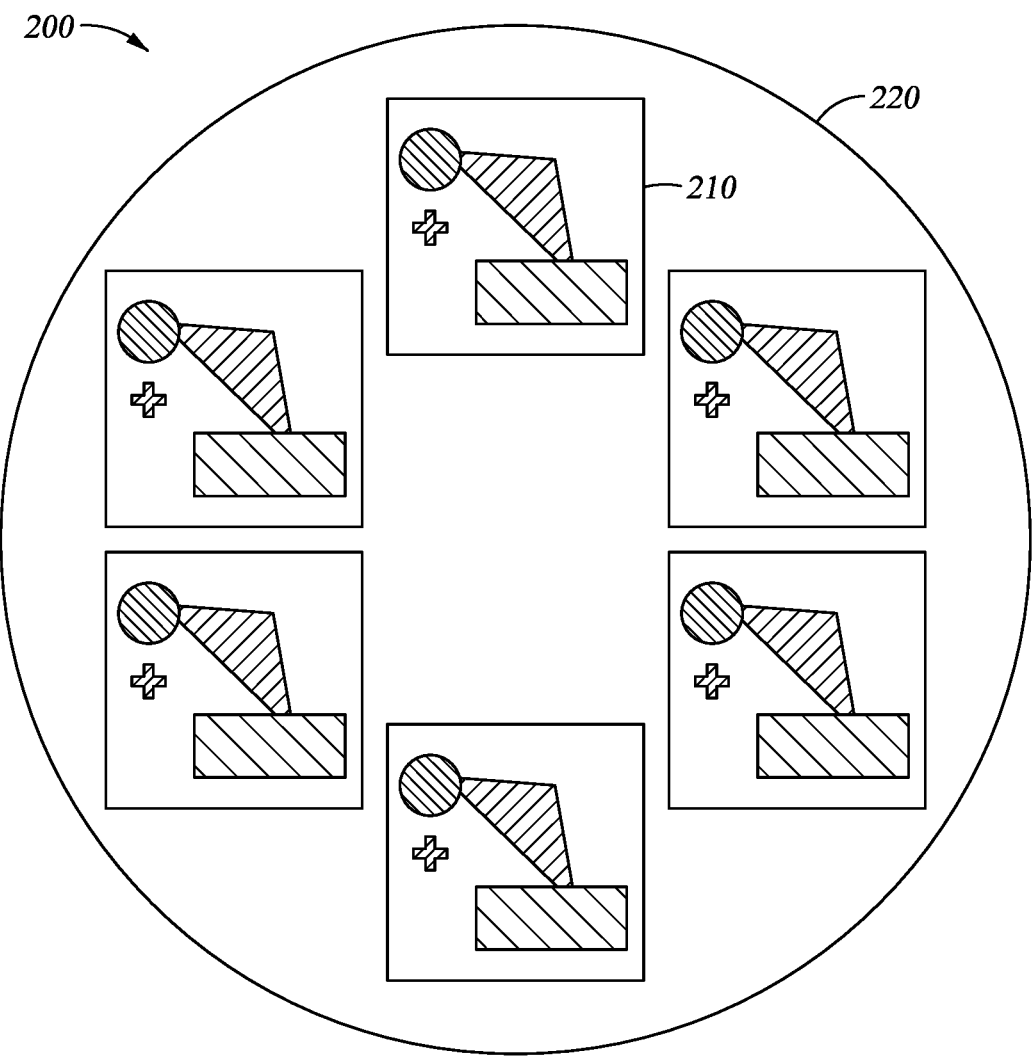
FIG. 2A is a top view of an exemplary large optical device substrate according to embodiments described herein.

FIG. 2A is a top view of an exemplary large optical device substrate 220 with a plurality of stitched design files 210 projected thereunto, according to embodiments described herein. The large optical device substrate 220 may be supported by a stage, such as stage 106 of the lithography environment 100 depicted in FIG. 1. The plurality of stitched design files 210 are projected unto the large optical device substrate 220 in order to accommodate the size of the substrate 220.

The substrate 220 comprises any suitable material, for example, glass, which is used as part of an optical device. In some embodiments, the large optical device substrate 220 includes a material selected from silicon (Si), silicon dioxide (SiO$_2$), germanium (Ge), silicon germanium (SiGe), sapphire, high-index transparent materials such as high-refractive-index glass, or a combination thereof. In other embodiments, which can be combined with other embodiments described herein, the substrate 220 is made of other materials capable of being used as a part of an optical device. The substrate 220 has a film layer to be patterned and formed thereon, such as by pattern etching thereof, and a photoresist layer formed on the film layer to be patterned, which is sensitive to electromagnetic radiation, for example UV or deep UV "light".

The photoresist layer for patterning the film layer on the substrate 220 may be a positive photoresist or a negative photoresist. A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. After exposure of the photoresist to the electromagnetic radiation, the photoresist is developed to leave an exposure of the underlying film layer. Then, using the patterned photoresist, the underlying thin film is pattern etched through the openings in the patterned photoresist to form a portion of the electronic circuitry of the display panel.

Figure 2B:
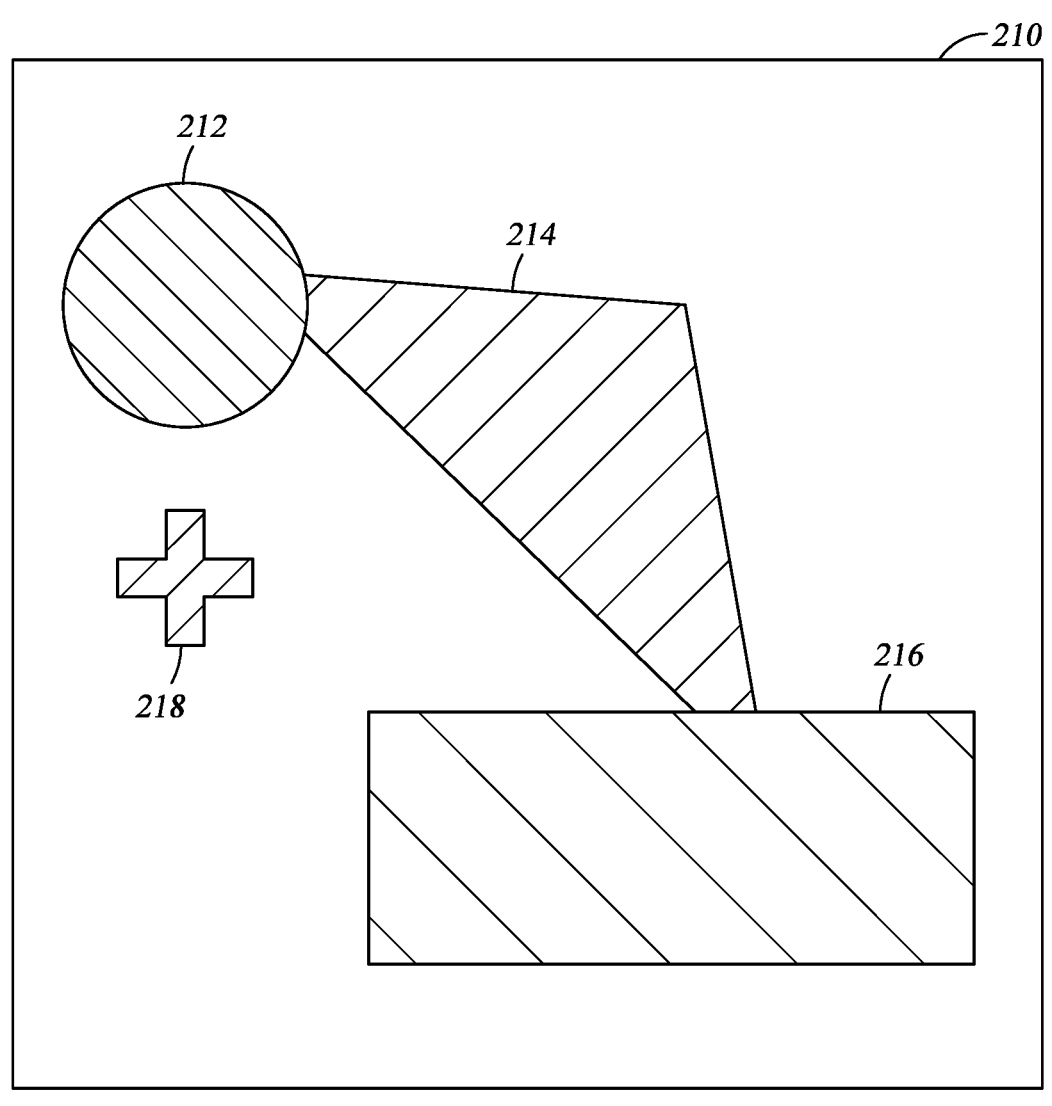
FIG. 2B is a top view of an exemplary stitched design file according to embodiments described herein.

FIG. 2B is a top view of an exemplary stitched design file 210 according to embodiments described herein. The stitched design file 210 may comprise one or more polygons, including a first polygon 212, a second polygon 214, and a third polygon 216. The one or more polygons correspond to portions of the photoresist layer to be exposed to electromagnetic radiation. Design files for each of the one or more polygons are stitched together to create the stitched design file 210. The stitched design file 210 also comprises an alignment mark 218.

Figure 3:
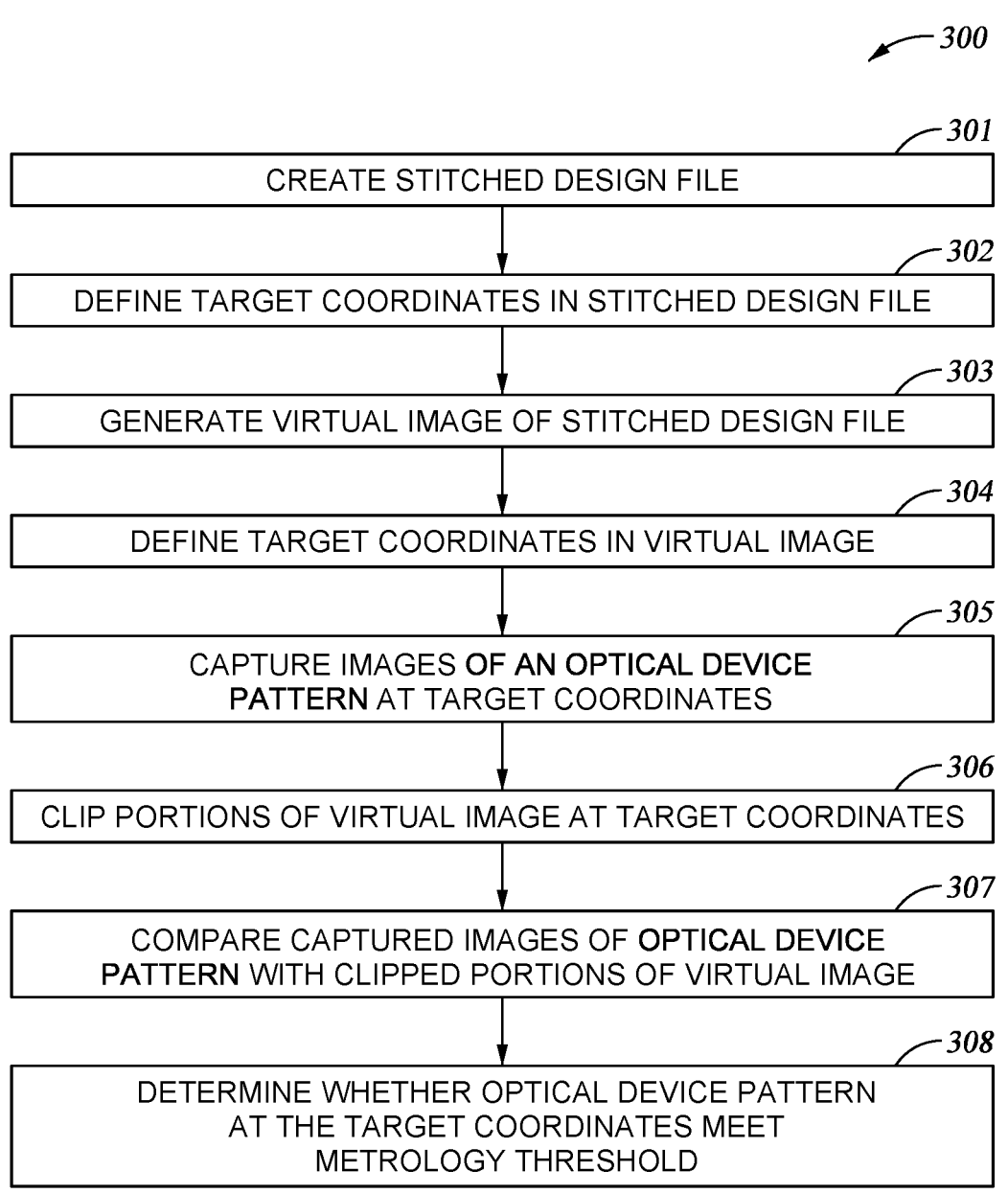
FIG. 3 is a flow diagram according to embodiments described herein.
Figures 4A, 4B, 4C:
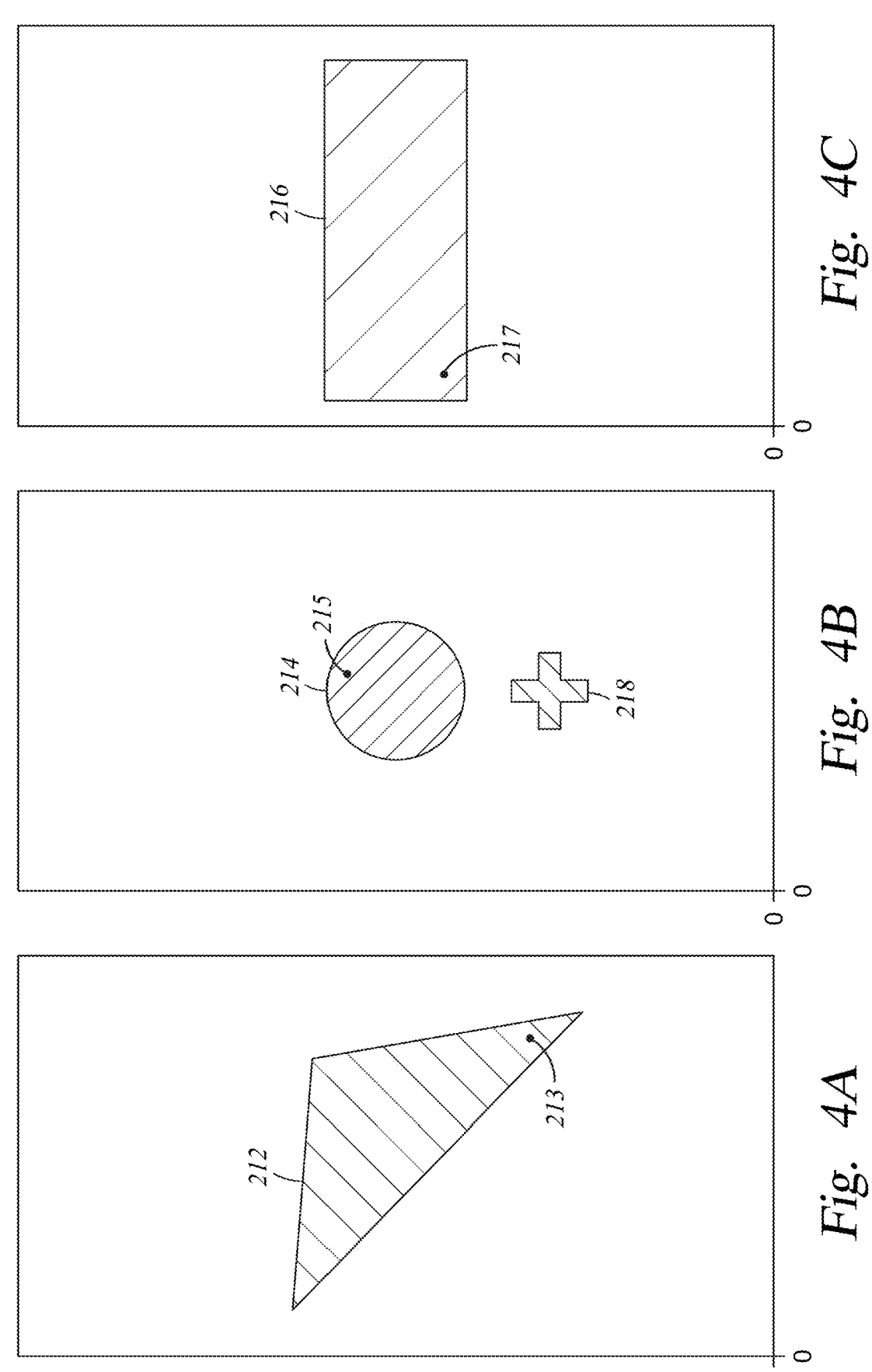
FIG. 4A-4C shows top views of separate design files according to embodiments described herein.
Figure 5:
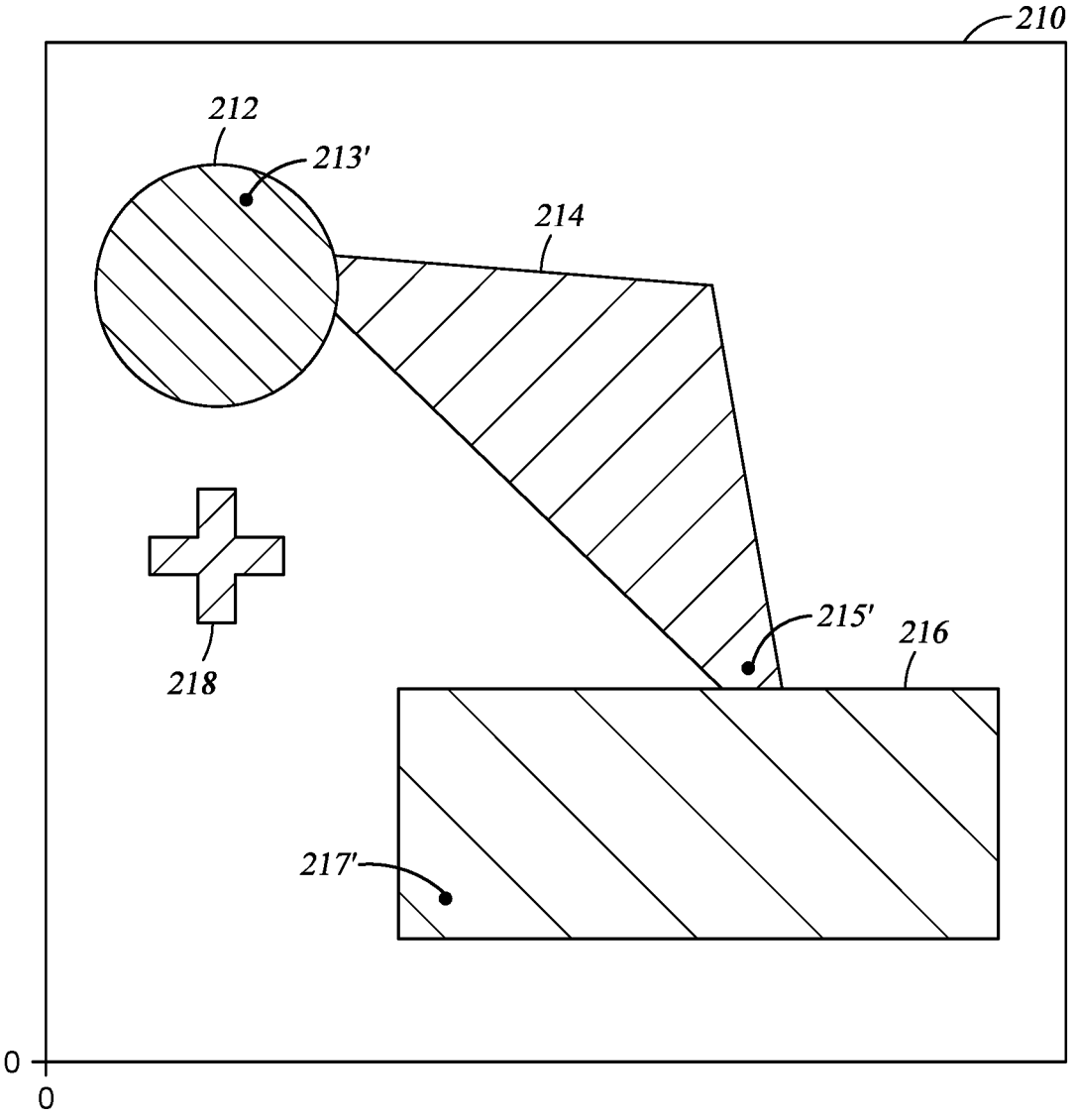
FIG. 5 is a top view of an exemplary stitched design file according to embodiments described herein.

FIG. 3 is a flow diagram of a method for metrology of optical device design patterns formed from lithography stitching, according to embodiments described herein; FIGS. 4A-4C are top views of examples of each of a plurality of masks that may be stitched together to form optical device design patterns, according to embodiments described herein; and FIG. 5 is a top view of an exemplary stitched design file, according to embodiments described herein. FIGS. 3, 4A-4C, and 5 are herein described together for clarity.

Method 300 begins at operation 301 with the creating of a stitched design file, for example, the stitched design file 210 in FIG. 5 comprising images of a plurality of masks stitched together. In one embodiment, the plurality of masks comprises a first mask 401, a second mask 402, and a third mask 403, as shown in FIGS. 4A-4C. In certain embodiments, the plurality of masks may be stitched together by a lithography stitching process. In some embodiments, in order to accommodate a large optical device substrate, such as the large optical device substrate 220 in FIG. 2A, the plurality of masks stitched together is larger than 26×33 mm in at least one dimension. In some embodiments, the plurality of masks is larger than 26×33 mm in two dimensions.

As shown in FIGS. 4A-4C, the plurality of masks stitched together to form the stitched design file 210 in FIG. 5 may each include one or more polygons. In the example shown, the first mask 401, the second 402, and the third mask 403 include the first polygon 212, the second polygon 214, and the third polygon 216, respectively. In one embodiment, which can be combined with other embodiments herein, one or more targets are defined in each of the plurality of masks prior to the stitching process in operation 301. The one or more targets correspond to the one or more polygons in each of the masks and are each defined with a corresponding target coordinate. In the example shown, a first target 213 is defined on the first mask 401 for the first polygon 212, a second target 215 is defined on the second mask 402 for second polygon 214, and a third target 217 is defined on the third mask 403 for the third polygon 216. The corresponding target coordinates for targets 213, 215, and 217 on each of the plurality of masks may be defined based on a reference point defined on each of the plurality of masks. In the example shown in FIGS. 4A-4C, the reference point for defining the target coordinates is the lower left corner (0,0) in each individual mask of the plurality of masks. The corresponding target coordinates in the first, second, and third masks 401, 402, 403 shown may each be defined as (x1, y1) for Target 213, (x2, y2) for Target 215, and (x3, y3) for Target 217.

In some embodiments, an alignment mark, such as the alignment mark 218 in FIG. 4B, may also be defined on one or more of each of the plurality of masks stitched together in operation 301. In some embodiments, the alignment mark 218 may be defined by both SEM alignment and optical alignment. In some embodiments, the alignment mark 218 may comprise a segmented mark or a solid mark. In some embodiments, the alignment mark 218 may be of a cross or any other polygon or shape.

At operation 302, a second set of target coordinates corresponding to the targets 213, 215, and 217 on each of the plurality of masks is defined in the stitched design file 210. The second set of target coordinates are defined based on a reference point on the stitched design file 210.

As shown in FIG. 5, in one embodiment, which can be combined with other embodiments herein, the second set of target coordinates in the stitched design file 210 for targets corresponding to the targets 213, 215, and 217 on the first, second, and third polygons 212, 214, and 216 are defined based on the lower left corner (0,0) reference point of the stitched design file 210. In the stitched design file 210, the second set of target coordinates for the targets 213, 215, 217 may each be defined as (x1', y1') for Target 213, (x2', y2') for Target 215, and (x3', y3') for Target 217. The second set of target coordinates for the stitched design file 210 may be utilized for CD-SEM measurement to locate the targets 213, 215, and 217 on the optical device pattern.

At operation 303, a virtual image of the stitched design file 210 is generated by combining the individual GDS files used to fabricate each of the plurality of masks stitched together in the stitched design file 210. The virtual image is a combination of individual GDS files corresponding to each of the plurality of masks of the stitched design file 210. The individual GDS files are combined in order to create one GDS file which the resulting virtual image shows the same optical device pattern as the stitched design file 210.

In operation 304, targets 213, 215, and 217 defined in the stitched design file 210 in operation 302 and any alignment marks on the stitched design file 210, such as the alignment mark 218, are correspondingly also defined in the virtual image generated in operation 303. The targets in the virtual image may correspondingly be defined as targets 213', 215', and 217'. The targets 213', 215', and 217' in the virtual image are defined using the same reference point used to define the second set of target coordinates in the stitched design file 210. In one embodiment, the targets 213', 215', and 217' in the virtual image are defined based on the same lower left corner (0,0) reference point of the virtual image as in the stitched design file 210. Accordingly, the target coordinates defined for the targets 213', 215', and 217' in the virtual image may in turn match the second set of target coordinates defined for the stitched design file 210 in operation 302.

At operation 305, the method 300 continues with capturing images of portions of an optical device pattern at each of the target coordinates defined in operation 304 for the virtual image. With reference to the FIG. 1, the optical device pattern may correspond to the substrate 220 disposed on the stage 106 and patterned with the mask 108. A GDS clip tool may be used to take images of the optical device pattern at each of the target coordinates, in order to achieve alignment and target automatic pattern recognition and CD-SEM measurement.

In operation 306, portions of the virtual image generated in operation 303 are clipped at each of the target coordinates defined in operation 304.

Figures 6A, 6B, 6C:
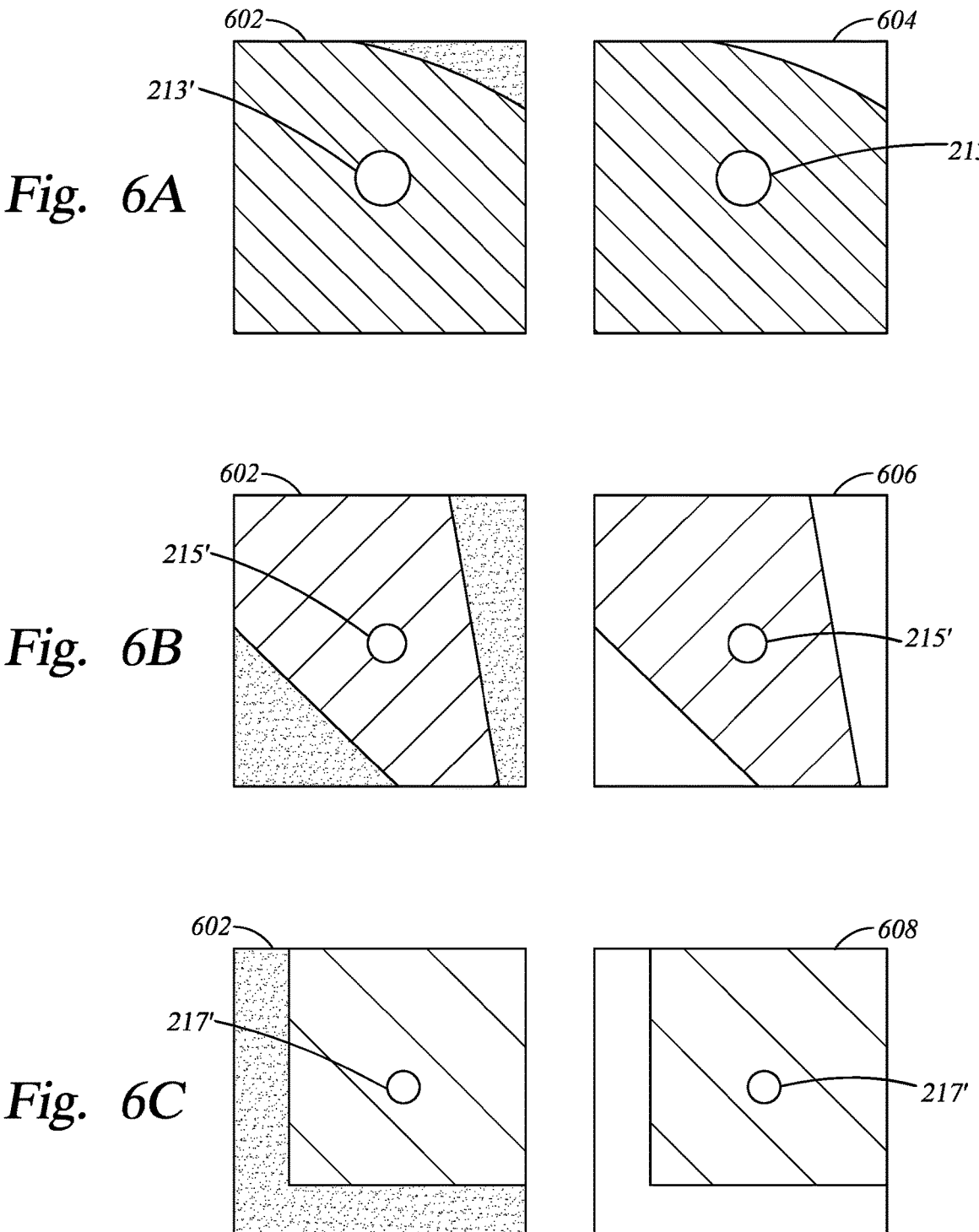
FIGS. 6A-6C are top views of example design file comparisons according to embodiments described herein.

At operation 307, the captured images of the optical device pattern from operation 305 are compared to the clipped portions of the virtual image from operation 306, as shown in FIGS. 6A-6C.

Method 300 concludes at operation 308 with determining whether the optical device pattern at each of the target coordinates defined in operation 304 meets a threshold value when compared to the clipped portions of the virtual image at the same target coordinates.

FIGS. 6A-C are top views of example design file comparisons between the captured images of the optical device pattern from operation 305 and the clipped portions of a virtual image 602, such as the clipping of the virtual image from method 300 in operation 306, according to embodiments described herein. For example, FIG. 6A corresponds to images of portions of the first polygon 212 from the virtual image 602 and a corresponding captured image 604; FIG. 6B corresponds to images of portions of the second polygon 214 from the virtual image 602 and a corresponding captured image 606, and FIG. 6C corresponds to images of portions of the third polygon 216 from the virtual image 602 and corresponding captured image 608. A comparison between the captured images of the optical device pattern at each of the targets 213', 215', 217' (on the right) and the clipped portions of the virtual image 602 at corresponding targets 213', 215', and 217' (on the left) is performed in order to determine whether the optical device pattern at the targets 213', 215, 217' meet a metrology threshold value.

In summation, aspects of the methods and apparatus provide significant advantages compared to conventional apparatus and methods. The methods provided allow for device metrology of optical device patterns formed from lithography stitching. This provides a way to accurately perform lithography for large optical devices, while improving conventional resolution and accuracy.

While the foregoing is directed to embodiments of the present disclosure, other and further embodiments of the disclosure may be devised without departing from the basic scope thereof, and the scope thereof is determined by the claims that follow.

What is claimed is:

1. An optical device metrology system, the system comprising:

a stage operable to support a large optical device substrate;

a light source positioned above the stage operable to project light through an optical device pattern mask onto the large optical device substrate;

a camera positioned above the stage configured to capture an image of the large optical device substrate; and

a controller, wherein the controller is configured to:

create a stitched design file comprising a first mask and a second mask stitched together, wherein the controller creates the stitched design file by:

defining target coordinates for each of the first mask and the second mask;

defining an alignment mark on the first mask and the second mask; and generating a virtual image of the stitched design file by combining the first mask, the second mask, and the alignment mark;

capture images of an optical device pattern at each of the target coordinates with the camera, the optical device pattern corresponding to an optical device pattern mask projected onto the large optical device substrate disposed on the stage;

compare the captured images of the optical device pattern mask at each of the target coordinates to virtual images of the stitched design file at each of the target coordinates; and determine whether the optical device pattern at each of the target coordinates meets a threshold value.

2. The system of claim 1, wherein the first mask, the second mask, and a third mask when stitched together is larger than 26×33 mm.

3. The system of claim 1, wherein:

an image of the first mask comprises a first polygon; and the image of the second mask comprises a second polygon.

4. The system of claim 3, wherein the first polygon and the second polygon comprise different shapes.

5. The system of claim 1, wherein the alignment mark is a segmented mark.

6. The system of claim 1, wherein the alignment mark is a solid mark.

7. The system of claim 1, wherein the virtual image is clipped at each of the target coordinates and the captured images of the optical device pattern are compared to the clipped virtual image at each of the target coordinates.

8. The system of claim 1, wherein the stitched design file further includes a third mask stitched together with the first mask and the second mask, wherein the controller creates the stitched design file further by:

defining a target coordinate for the third mask;

defining an alignment mark on the third mask; and generating the virtual image of the stitched design file by combining the first mask, the second mask, the third mask, and the alignment mark.

9. A non-transitory computer-readable medium storing instruction that, when executed by a processor, cause a computer system to perform the operations of:

creating a stitched design file comprising images of a plurality of masks;

defining a first set of target coordinates for each of the plurality of masks in the stitched design file;

defining an alignment mark for the stitched design file;

defining a second set of target coordinates corresponding to the plurality of masks, wherein the second set of target coordinates are utilized for a critical dimension scanning electron microscope (CD-SEM) measurement to locate the second set of target coordinates on an optical device pattern;

generating a virtual image of the stitched design file by combining the plurality of masks;

capturing images of the optical device pattern at each of the target coordinates of the first set of target coordinates and the second set of target coordinates, the optical device pattern corresponding to an optical device pattern mask projected onto a large optical device substrate;

comparing the captured images of the optical device pattern mask at each of the target coordinates to the virtual image of the stitched design file at each of the target coordinates;

determining whether the optical device pattern at each of the target coordinates meets a threshold value; and projecting the optical device pattern mask onto the large optical device substrate such that the large optical device substrate is to be printed by a lithography environment device according to the optical device pattern mask.

10. The non-transitory computer-readable medium of claim 9, wherein the plurality of masks when stitched together is larger than 26×33 mm.

11. The non-transitory computer-readable medium of claim 9, wherein the stitched design file comprises images of a first mask, a second mask, and a third mask stitched together.

12. The non-transitory computer-readable medium of claim 11, wherein:

an image of the first mask comprises a first polygon;

the image of the second mask comprises a second polygon; and the image of the third mask comprises a third polygon.

13. The non-transitory computer-readable medium of claim 12, wherein the first polygon, the second polygon, and the third polygon comprise different shapes.

14. The non-transitory computer-readable medium of claim 9, wherein the alignment mark is a segmented mark.

15. The non-transitory computer-readable medium of claim 9, wherein the alignment mark is a solid mark.

16. A method for optical device metrology of optical device patterns, the method comprising:

creating a stitched design file comprising at least a first mask, a second mask, and a third mask stitched together;

defining target coordinates for at least each of the first mask, the second mask, and the third mask in the stitched design file;

defining an alignment mark for the stitched design file;

generating a virtual image of the stitched design file by combining at least the first mask, the second mask, and the third mask and the alignment mark, wherein the virtual image corresponds to an optical device pattern mask;

capturing images of the optical device pattern at each of the target coordinates, the optical device pattern corresponding to the optical device pattern mask projected onto a large optical device substrate;

comparing the captured images of the optical device pattern at each of the target coordinates to the virtual image of the stitched design file at each of the target coordinates;

determining whether the optical device pattern at each of the target coordinates meets a threshold value; and projecting the optical device pattern mask onto the large optical device substrate, wherein the optical device pattern mask provides an optical device pattern to be written into a photoresist using an electromagnetic radiation output.

17. The method of claim 16, wherein the first mask, the second mask, and the third mask when stitched together is larger than 26×33 mm.

18. The method of claim 16, wherein:

an image of the first mask comprises a first polygon;

the image of the second mask comprises a second poly-gon; and the image of the third mask comprises a third polygon.

19. The method of claim 16, wherein the alignment mark is a segmented mark.

20. The method of claim 16, wherein the alignment mark is a solid mark.

* * * * *